United States Patent
Jensen et al.

(10) Patent No.: US 11,378,688 B2
(45) Date of Patent: Jul. 5, 2022

(54) OPTICAL SYSTEMS, DEVICES, AND METHODS INCLUDING HIGH PERFORMANCE OPTICAL RECEIVERS

(71) Applicant: Bifrost Communications ApS, Kongens Lyngby (DK)

(72) Inventors: Jesper Bevensee Jensen, Albertslund (DK); Bo Pedersen, Kastrup (DK)

(73) Assignee: Bifrost Communications ApS, Kongens Lyngby (DK)

( * ) Notice: Subject to any disclaimer, the term of this patent is extended or adjusted under 35 U.S.C. 154(b) by 330 days.

(21) Appl. No.: 16/653,099

(22) Filed: Oct. 15, 2019

(65) Prior Publication Data

US 2020/0116863 A1 Apr. 16, 2020

Related U.S. Application Data

(60) Provisional application No. 62/745,732, filed on Oct. 15, 2018.

(51) Int. Cl.
*G01C 3/08* (2006.01)
*G01S 17/34* (2020.01)
(Continued)

(52) U.S. Cl.
CPC .......... *G01S 17/34* (2020.01); *G01S 7/4808* (2013.01); *H01S 5/12* (2013.01); *G01S 17/88* (2013.01)

(58) Field of Classification Search
None
See application file for complete search history.

(56) References Cited

U.S. PATENT DOCUMENTS

2002/0071109 A1* 6/2002 Allen .................. G01S 17/34
356/5.01
2007/0273863 A1* 11/2007 Leep .................. G01S 7/497
356/5.15
(Continued)

FOREIGN PATENT DOCUMENTS

WO WO 2019035803 * 2/2019 ............. G01S 13/52

OTHER PUBLICATIONS

Poulton et al, Frequency-modulated Continuous-wave LIDAR Module in Silicon Photonics, W4E.3.pdf OFC 2016.
(Continued)

*Primary Examiner* — Mark Hellner
(74) *Attorney, Agent, or Firm* — Nemphos Braue LLC; Michael Antone (57) ABSTRACT

Optical systems, devices, and methods are provided for determining various characteristics, such as quantity, movement, distance and speed/velocity of an object relative to the system. The system and method includes an optical transmitter to transmit an output optical signal carrying an electrical reference signal and an optical receiver to receive a reflection of the output optical signal. The receiver includes at least one local oscillator providing local oscillator light at a local oscillator frequency, at least one combiner to combine the reflection of the output optical signal with the local oscillator light into a coupled optical signal. An optical-electrical converter converts the coupled optical signal into a first electrical signal, which is rectified via an envelope detector/rectifier to provide a first rectified electrical signal, which is processed by a signal processor along with the reference signal to calculate various characteristics of an object that reflected the output optical signal, such as the quantity, movement, distance, velocity, etc.

20 Claims, 5 Drawing Sheets

(51) Int. Cl.
    *G01S 7/48*     (2006.01)
    *H01S 5/12*     (2021.01)
    *G01S 17/88*    (2006.01)

(56)            References Cited

U.S. PATENT DOCUMENTS

2008/0018881 A1    1/2008  Hui
2017/0343652 A1   11/2017  De Mersseman et al.
2018/0278337 A1    9/2018  Jensen
2019/0018114 A1*   1/2019  Patterson ................ G01S 17/86
2020/0011994 A1*   1/2020  Thorpe ................... G01S 17/34

OTHER PUBLICATIONS

Gao et al., Frequency-modulated continuous-wave lidar using VQ modulator for simplified heterodyne detection, p. 2022-4, Optics Letters / vol. 37, No. 11 / Jun. 1, 2012.
Bechadergue et al, Visible Light Phase-Shift Rangefinder for Platooning Applications, 2016 IEEE 19th International Conference on Intelligent Transportation Systems (ITSC).
Nejad et al, A new design of laser phase-shift range finder independent of environmental conditions and thermal drift, Proceedings of the 9th Joint International Conference on Information Sciences (JCIS-06), https://doi.org/10.2991/cis.2006.83.
Amann et al, Laser ranging: a critical review of usual techniques for distance measurement, Opt. Eng. 40(1) Jan. 10-19, 2001).

* cited by examiner

OPTICAL SYSTEMS, DEVICES, AND METHODS INCLUDING HIGH PERFORMANCE OPTICAL RECEIVERS

CROSS-REFERENCE TO RELATED APPLICATIONS

This application claims the benefit of and priority to U.S. Provisional Patent Application No. 62/745,732 filed on Oct. 15, 2018, which is hereby incorporated by reference in its entirety.

STATEMENT REGARDING FEDERALLY SPONSORED RESEARCH OR DEVELOPMENT

Not Applicable

REFERENCE TO SEQUENCE LISTING, A TABLE, OR A COMPUTER PROGRAM LISTING COMPACT DISC APPENDIX

Not Applicable

BACKGROUND OF THE INVENTION

Field of the Invention

The present invention generally relates to optical systems with improved performance. More specifically, the invention relates to optical detection systems, devices, and methods with improved receiver and system performance.

Background Art

LIDAR systems have been developed over the past few decades as a solution to range detection problems that could not be adequately addressed with traditional radio wave detection methods. Light detection systems employ various techniques for transmitting and receiving the reflected light and making a range calculation based on the difference between the transmitted and received light introduced by time of flight ("ToF") of the light and various techniques, such as measurement of doppler-shift, for determining velocity.

The emergence of high performance applications, such as autonomous vehicles, unmanned aerial systems, etc. have increased the demand for range detection systems, i.e., sensors. The capabilities of these new and traditional applications will be based at least in part on the performance of the various sensor systems providing data for the applications. As such, there is a growing demand for high performance range detection and other sensor systems that support the continued improvement in high performance applications.

BRIEF SUMMARY OF THE INVENTION

The present invention addresses the above noted needs by providing optical systems, devices, and methods that enable high performance range detection, optical time-domain reflectometry ("OTDR"), and other applications. The systems may include homodyne and heterodyne detection receivers in combination with directly and externally modulated optical sources and bidirectional/shared components that overcome the challenges of the prior art solutions to enable more compact and lower cost systems to be deployed in various applications.

Optical systems, devices, and methods are provided for detecting, determining, or measuring, various characteristics, such as quantity, movement, distance, and velocity of an object relative to the system. The systems and methods include one or more optical transmitters to transmit output optical signals carrying an electrical reference signal and one or more optical receivers to receive reflections of the output optical signals. The receiver includes at least one local oscillator providing local oscillator light at a local oscillator frequency, at least one combiner to combine the reflection of the output optical signal with the local oscillator light into a coupled optical signal. The local oscillator may or may not include the optical sources used in the optical transmitter. One or more optical-electrical converters convert the coupled optical signal into electrical signals, which may be rectified via envelope detectors/rectifiers to provide first rectified electrical signals, which are processed by one or more signal processors along with the reference signal to calculate various characteristics of the reflection of the output optical signal, such as the quantity, movement, distance, velocity, etc. of an object that reflected the output optical signal. In addition, the optical system may include a plurality of optical transmitters and receivers operating at one or more wavelengths to provide multi-dimensional characterizations of objects.

In various embodiments, the reference signal may be combined with the reflected optical signal in the optical domain or after the reflected optical signal has been received and converted to an electrical signal. The electrical reference signal may include analog and/or digital reference signals with or without reference identifiers as may be suitable for the response times and levels of precision desired. The optical-electrical converters may be implemented with a bandwidth that accounts for the bandwidth of the reference signal and modulated light including variations, such as frequency chirp, burst-mode spectral excursion, temperature, aging, etc. The local oscillator may be controlled, or merely selected, to enable efficient reception of reflected optical signal relative to the bandwidth of the receiver.

Accordingly, the present disclosure addresses the continuing need for range detection and object characterization systems and receivers with improved cost and performance.

BRIEF DESCRIPTION OF THE DRAWINGS

The accompanying drawings are included for the purpose of exemplary illustration of various aspects of the present invention, and not for purposes of limiting the invention, wherein.

In the drawings and detailed description, the same or similar reference numbers may identify the same or similar elements. It will be appreciated that the implementations, features, etc. described with respect to embodiments in specific figures may be implemented with respect to other embodiments in other figures, unless expressly stated, or otherwise not possible.

DETAILED DESCRIPTION OF THE INVENTION

Optical systems 10 of the present invention may be employed in various configurations to detect target objects and determine various characteristics of the target objects relative to the optical system 10. The system 10 may be a stand-alone fixed or mobile unit or associated with a host object that may be a stationary object, e.g., a pole, or a moving object, e.g., water, land, or air craft. The target objects being detected, measured, etc. may be very large, e.g., vehicles, or very small, e.g., particles, depending upon the particular application of the system 10.

Figure 1:
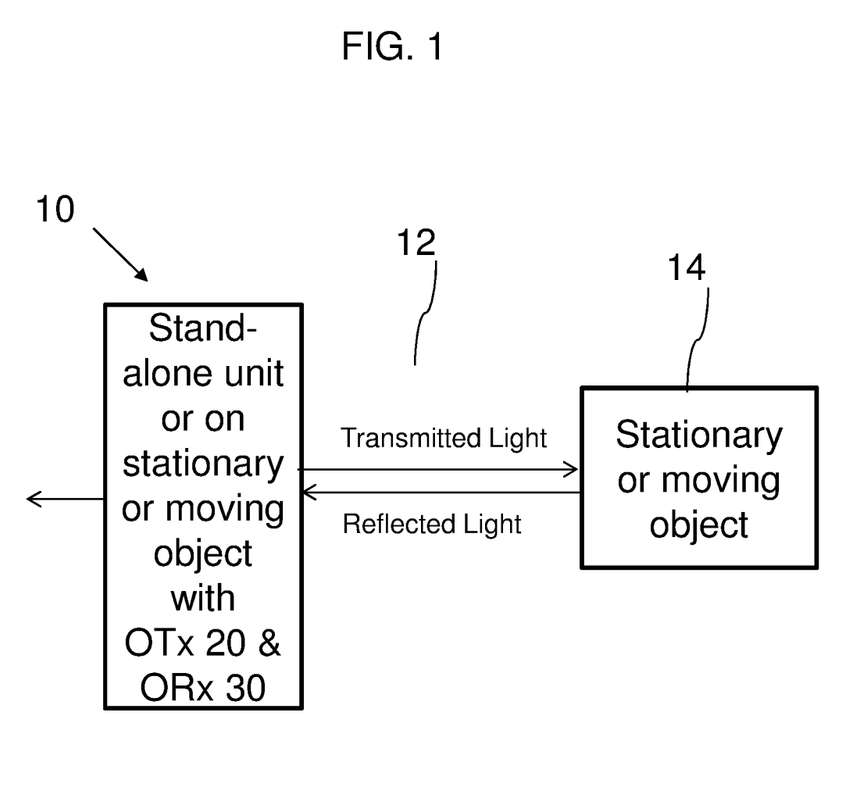
FIGS. 1-5 show exemplary optical systems embodiments and exemplary measurements.

FIG. 1 illustrates optical system 10 of the present invention, which may include one or more optical transmitters (OTx) 20 to transmit output optical signals carrying a reference signal through a medium 12 and one or more optical receivers (ORx) 30 to receive input optical signals that may include at least some of the output optical signals that have been reflected off a target object 14 back through the medium 12 to the optical receivers 30. One of ordinary skill will appreciate that the medium 12 in many measurement and detection applications of the system 10 will be free space, i.e., non-waveguide, but may include a wide range of materials, e.g., air (gases), water (liquids), glass (solids), vacuums, etc., in various combinations depending upon the application and the light frequency(ies) used in the system 10.

Since the optical transmitters 20 and optical receivers 30 generally may be co-located and, in some embodiments, part of the same unit, the transmitter 20 and receiver 30 may share components, such as lenses, combiners, splitters, signal generators, etc., as described herein and shown in the drawings. As noted below, it will be appreciated that while discrete components may be depicted in the drawings to facilitate explanation, the various components may be implemented and integrated in various combinations employing fiber, non-fiber waveguides, free-space, and photonic integrated circuit ("PIC") components and transmission media.

Figure 2:
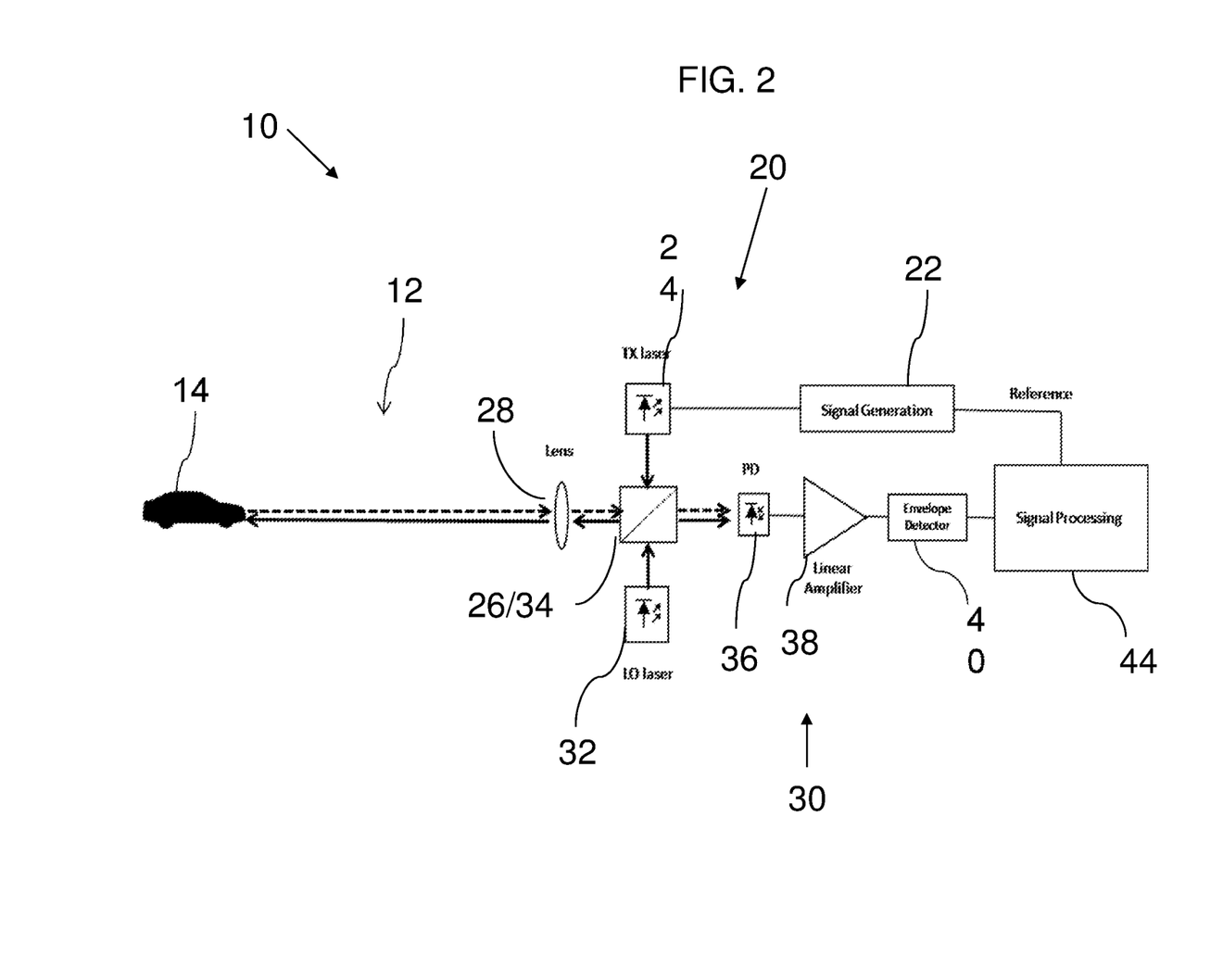

As shown in FIG. 2, the system 10 may include an electrical reference signal generator 22, which may be analog, such as a modulated radio frequency (RF) carrier from a RF source, or digital, such as a digital signal processor, to provide a reference signal or one or more electrical inputs configured to receive the reference signal from an external electrical signal generator. The reference signal may be split, or duplicated, inside or outside the system, such as via an electrical splitter into a transmit portion and a receive portion. The transmit portion may be used to directly modulate an optical source 24 in the optical transmitter 20 and/or externally modulate light output at a transmit frequency/wavelength from the optical source 24 to produce modulated light. The modulated light is output from one or more optical output ports of the optical transmitter 20, or transmit section of the system 10, as an output optical signal.

The optical source 24 may include various types of lasers, such as a DFB, VCSEL, DBR, ECL or other type of laser, depending upon the particular performance and cost characteristics desired by the skilled artisan. The present invention generally enables the use of commercial off the shelf lasers for many applications, thereby enabling a low cost, robust platform. In other applications, it may be desirable to use an external modulator to impart the reference signal onto the output optical signal and/or to use one or more custom optical sources. For example, one or more lasers may be used as the optical source 24 in the optical transmitter 20 and as the local oscillator ("LO") 32 in the optical receiver 30.

In various embodiments, one or more couplers 26 may be provided to couple the output optical signal from the optical transmitter 24 via one or more lenses 28 to the medium 12. The lenses 28 may be a discrete lens and/or a lens fiber or other waveguide. The coupler 26 may also be used to split the output optical signal into multiple signals as further described below. As further described, the coupler 26 may be used bi-directionally as part of the optical receiver 30.

The optical receiver 30 receives light from the medium 12 through one or more optical input ports which may include one or more lenses 28, which may or may not be shared with the optical transmitter 20 for the output optical signal. The received light may include reflections of the output optical signal ("reflected optical signals") from the target object 14 and may likely also include other light present in the medium 12 and possibly reflections from objects other than the target object 14 that may represent noise in the input optical signal.

The optical receiver 30, or receive section of the system 10, may include:
- one or more local oscillators 32, each providing light at a local oscillator frequency/wavelength;
- at least one coupler 34 to couple the received light with the local oscillator light from the local oscillators 32 into a combined optical signal;
- at least one optical-electrical ("OE") converter (e.g. photodiodes) 36 having a predefined frequency bandwidth, to convert the combined received and local oscillator light into a received electrical signal;
- one or more linear amplifiers 38 may be included in various embodiments to amplify the received electrical signal from the optical-electrical converters 36;
- at least one rectifier (e.g., envelope detector) 40 to rectify the received electrical signals and provide corresponding rectified electrical signals;
- at least one electrical combiner (e.g., mixer) 42 to combine each of the corresponding rectified electrical signals with the receive portion of the reference signal to generate a detection signal based on differences between the transmit and receive portions of the reference signal; and
- at least one signal processor 44 to calculate various characteristics of the target object, such as quantity, movement, distance and velocity relative to the optical receiver based on the detection signal.

The reference signal may include analog and/or digital reference signals with or without reference identifiers, as may be suitable for response times and levels of precision desired by the skilled artisan. In various embodiments, transmit portion of the reference signal from the received reflection of the output signal is compared to the receive portion of the reference signal provided directly to the receiver to determine the time of flight of the reflected output optical signal and the distance of the target object 14 from the system 10. The relative intensity of the transmitted and received optical signals at an instance and/or over time may be used to perform various calculations.

Multiple comparisons over time may be used to calculate the relative quantity, movement, speed/velocity of the object including the system 10 and the target object 14, which may also be used in combination with other speed, or velocity, measurements of the host object including the system 10. In various embodiments, the reference signal imparted to the output optical signal may include a time stamp or other markers that may be used in the optical receiver 30 to calculate the time of flight of the reflected output optical signal and the distance of the target object 14 from the system 10. One or more of the above or other comparisons may be employed by the skilled artisan to perform detection, distance, and other calculations based on the time of flight and/or intensity of the reflections. In addition, the reference signal may be used to reduce the impact of noise in the input optical signal.

The optical-electrical converters 36 may be implemented with a bandwidth sufficient to convert a wide range of bandwidths used for the reference signal and the modulated light and may also be selected to account for variations resulting from frequency chirp, burst-mode spectral excursion, temperature, aging, etc., e.g., commercial off the shelf photodiodes and rectifiers may have a bandwidth of up to 40 GHz or more. The local oscillator 32 may be controlled, or merely selected (i.e., not controlled), to enable efficient reception of reflected optical signal relative to the bandwidth of the converters 36.

FIG. 2 embodiments may employ an electrically generated frequency-modulated continuous wave (EFMCW) generator to generate the reference signal as a sine-wave signal with a swept frequency (i.e., the amplitude of the sinusoidal modulation is kept constant/continuous and the frequency is swept/modulated). The frequency of the reference signal may be swept linearly up and down in a range within the bandwidth of the detection system. A modulation index of less than 1 may be used to allow for laser chirp to remain inside the receiver bandwidth. However, a higher amount of chirp may be tolerated compared to other coherent methods. The signal processing may utilize electrically homodyne or heterodyne detection. The reflected and recovered signal is then compared to the reference signal used to generate the transmit signal.

Figure 3:
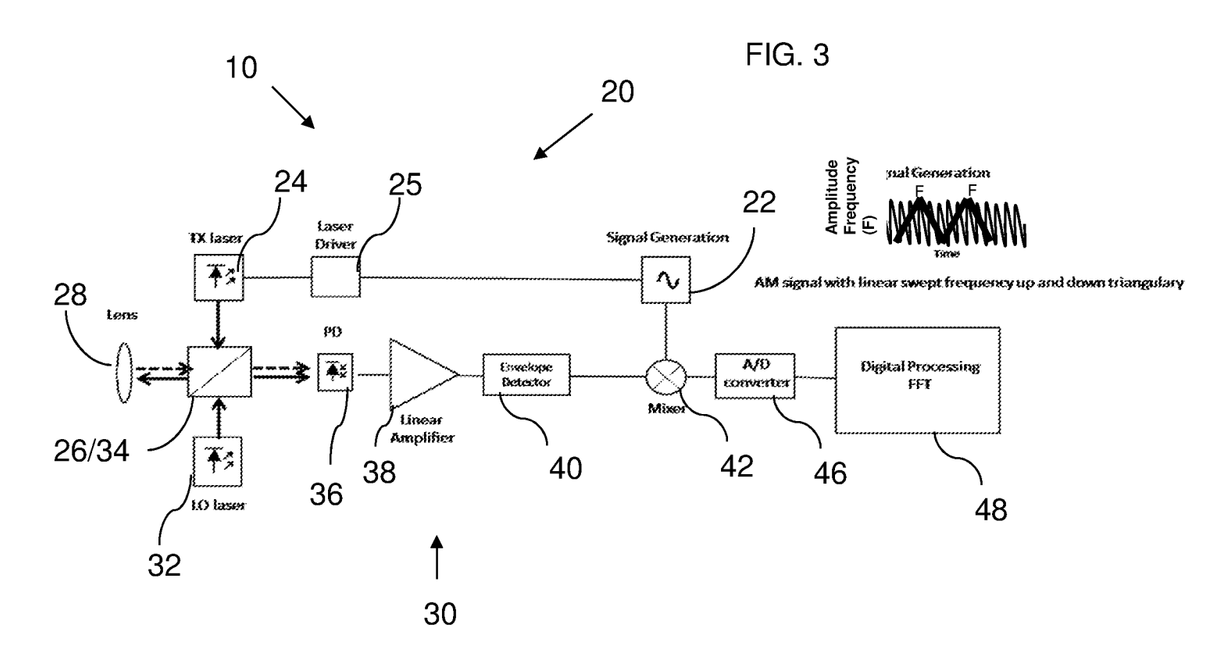

FIG. 3 embodiments are similar to the embodiments of FIG. 2 with the optical transmitter 20 including an optical source driver 25 to apply the reference signal to the optical source 24. In the receiver 30, the signal processor 44 may include an analog to digital ("A/D") converter 46 to convert the detection signal from an analog to a digital detection signal and a digital signal processor 48 to process the digital detection signal.

In these embodiments, an optical frequency-modulated continuous wave (OFMCW) optical signal may be created by control of the bias current of a directly modulated laser. The laser may be calibrated to obtain a linear frequency sweep up and down through control of the chirp versus bias. An alternative is to use an external modulator to create the swept, or to use a temperature controller to modulate the temperature of the laser in order to introduce the desired frequency modulation.

Figure 4:
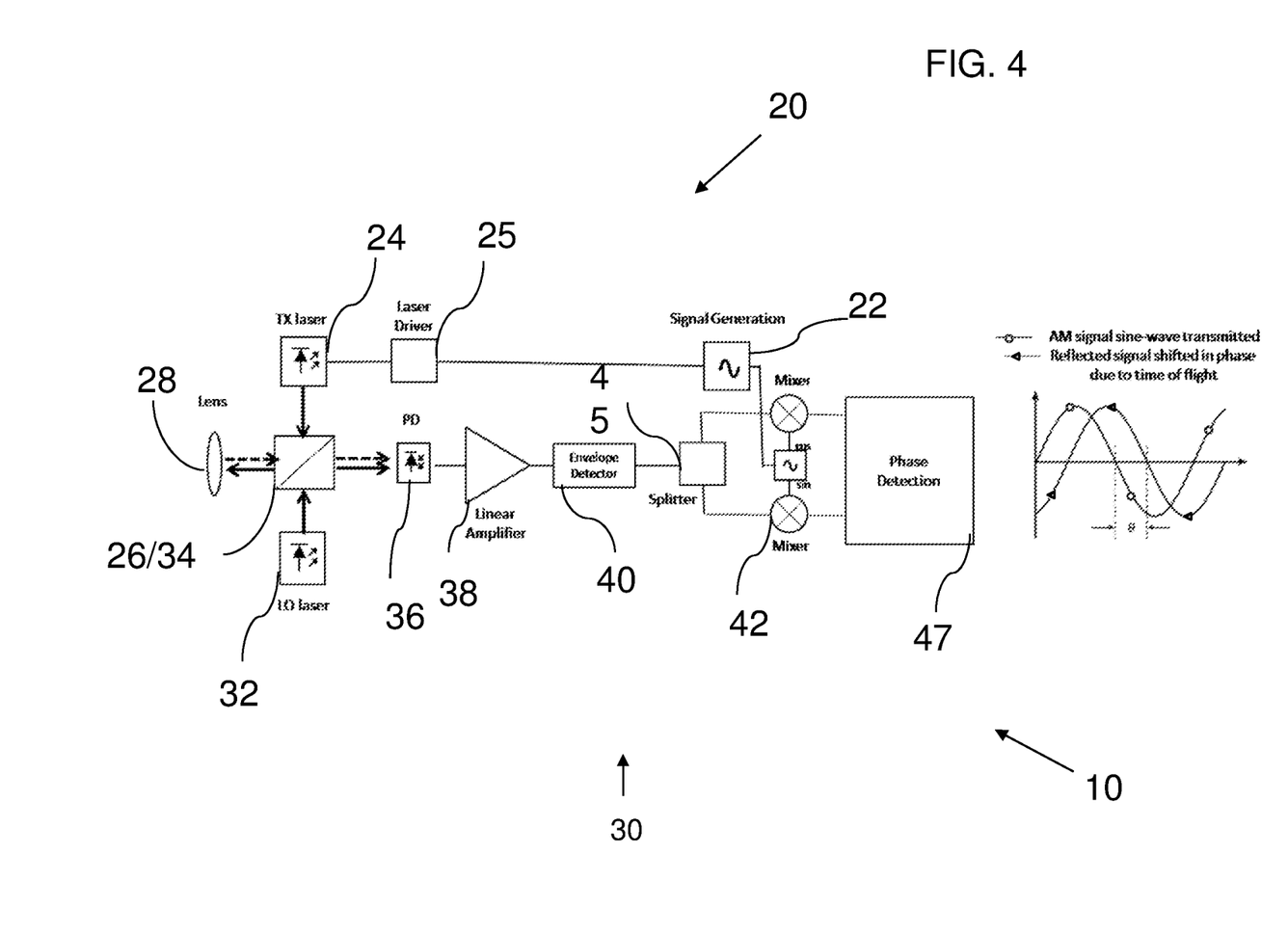

FIG. 4 embodiments illustrate the use of an electrical splitter 45 to split the rectified detection signal into two rectified electrical signals, which may be mixed with the reference signal via two electrical mixers 42 and provided to a phase detector 47.

Figure 5:
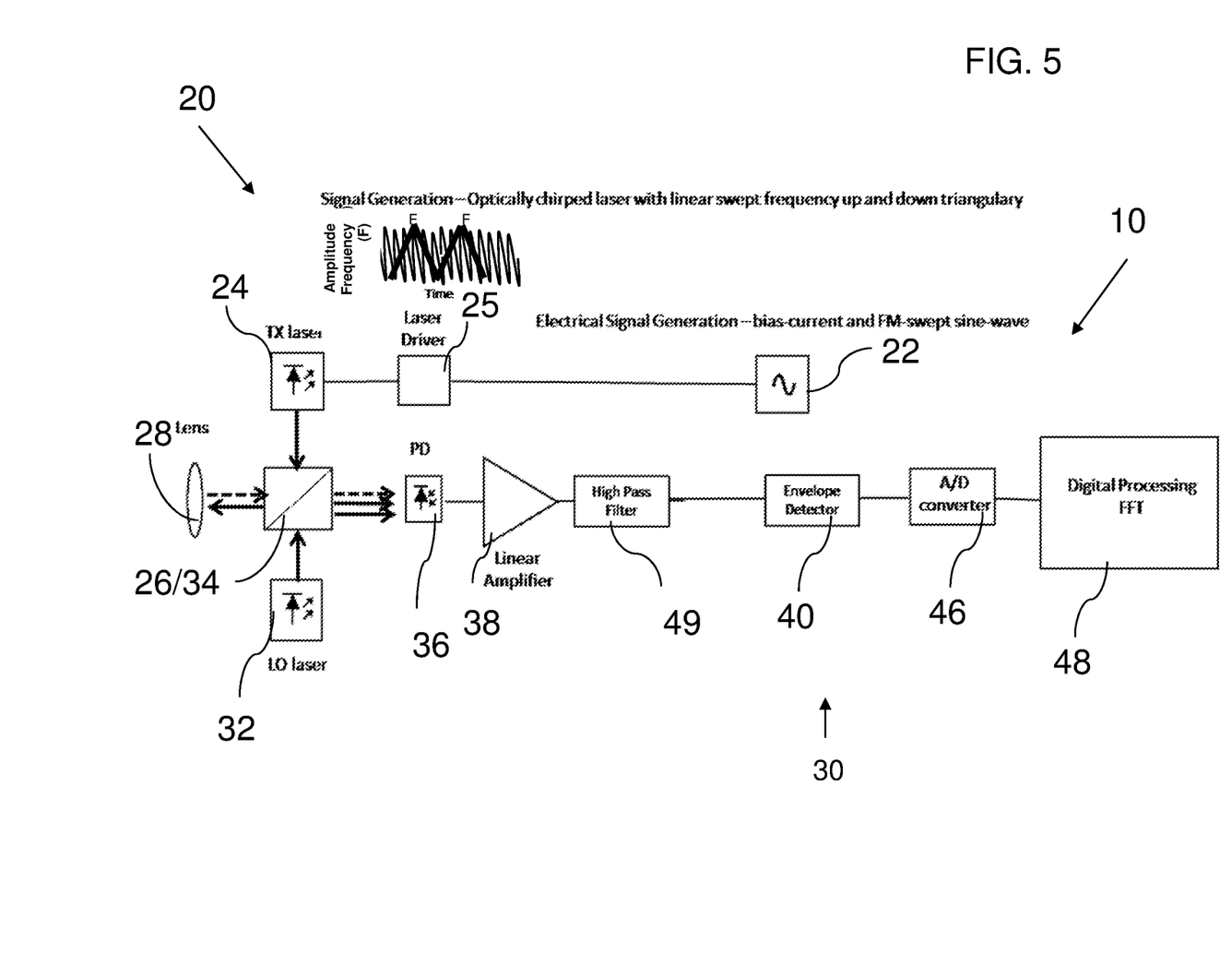

FIG. 5 embodiments illustrate the coupling of a portion of the output optical signal with the reflected input optical signal and the local oscillator light and employing a high pass filter 49 to provide the detection signal. In these embodiments, light from the local oscillator 32, reflected light, and transmission (fractional) light are all combine through one or more combiners 34 in the optical-electrical converter 36. An offset in frequency of the local oscillator 32 from the average transmit frequency to approximately in the middle of the electrical frequency band (channel) may be used to create, by the optical-electrical converter 36, the linear amplifier and high pass filter, a current I proportional to $E_{lo}*(E_t+E_r)$, where $E_{lo}$, $E_t$, & $E_r$ denotes the electrical field of the local oscillator, transmitted light, and reflected light, respectively. This term is squared and rectified in the envelope detector/rectifier 40, creating a term $E_{lo}^2*E_t*E_r$, from which a signal containing a frequency change may be found after low-pass filtering and used to calculate the distance traveled by and/or velocity of the reflected optical signal relative to the reference signal. The high-pass filter 49 may be used to filter out the mixing signal of $E_t*E_r$, which may be small, from the output of the optical-electrical converter 36.

The local oscillators 32 may generally include one or more fixed or tunable optical sources, such as lasers of various linewidths, to provide local oscillator light at one or more local oscillator frequencies, which may be offset from the frequency of the optical signal, i.e., the local oscillator frequency offset. The optical local oscillator laser 32 emitting light at an optical frequency (Flo) which is offset from the signal center frequency (Fc) by frequency-offset, or frequency difference, (dF). As described above, the local oscillator(s) 32 may include one or more lasers, such as a VCSEL, DFB, DBR, ECL or other type of laser. The local oscillator 32 may be tuned to a frequency or a wavelength of the signal. This can either be an in-band or an out-of-band configuration. In an in-band configuration, the local oscillator 32 is tuned to a frequency or wavelength within a spectrum of the signal. In an out-of-band configuration, the local oscillator 32 is tuned to a frequency or wavelength outside a spectrum of the signal. In this way, wavelength selectivity may be achieved using the local oscillator 32. Using the local oscillator 32 as a wavelength selector enables the system to operate with or without optical filters.

It will be appreciated that while the optical receiver embodiments described relative to FIGS. 2-5 depict using the reception of the input optical signal, which includes the reflected output optical signal, with one optical-electrical converter 36, the optical receiver 30 may include various embodiments involving multiple optical-electrical converters 36. For example, U.S. patent application Ser. No. 15/927,792, which is incorporated herein by reference in its entirety, describes various optical receiver embodiments including polarization diversity receivers that may be employed in the present invention. Other configurations utilizing multiple optical-electrical converters for further improvement of receiver sensitivity may include balanced receivers.

The foregoing disclosure provides examples, illustrations and descriptions of the present invention, but is not intended to be exhaustive or to limit the implementations to the precise form disclosed. Modifications and variations are possible in light of the above disclosure or may be acquired from practice of the implementations. These and other variations and modifications of the present invention are possible and contemplated, and it is intended that the foregoing specification and the following claims cover such modifications and variations.

As used herein, the term component is intended to be broadly construed as hardware, firmware, and/or a combination of hardware and software. It will be apparent that systems and/or methods, described herein, may be implemented in different forms of hardware, firmware, or a combination of hardware and software. The actual specialized control hardware or software code used to implement these systems and/or methods is not limiting of the implementations. Thus, the operation and behavior of the systems and/or methods were described herein without reference to specific software code—it being understood that software and hardware can be designed to implement the systems and/or methods based on the description herein.

Various elements of the system may employ various levels of photonic, electrical, and mechanical integration. Multiple functions may be integrated on one or more modules or units in the system 10.

Hardware processor modules may range, for example, from general-purpose processors and CPUs to field programmable gate arrays (FPGAs) to application specific integrated circuit (ASICs). Software modules (executed on hardware) may be expressed in a variety of software languages (e.g., computer code), including C, C++, Java™, Javascript, Rust, Go, Scala, Ruby, Visual Basic™, FORTRAN, Haskell, Erlang, and/or other object-oriented, procedural, or other programming language and development tools. Computer code may include micro-code or micro-instructions, machine instructions, such as produced by a compiler, code used to produce a web service, and files containing higher-level instructions that are executed by a computer using an interpreter and employ control signals, encrypted code, and compressed code.

Software may employ various input and output interfaces that may include one or more application programming interfaces and user interfaces to provide for data input and output. A user interface may include a graphical user interface, a non-graphical user interface, a text-based user interface, etc. A user interface may provide information for display. In some implementations, a user may interact with the information, such as by providing input via an input component of a device that provides the user interface for display. In some implementations, a user interface may be configurable by a device and/or a user (e.g., a user may change the size of the user interface, information provided via the user interface, a position of information provided via the user interface, etc.). Additionally, or alternatively, a user interface may be pre-configured to a standard configuration, a specific configuration based on a type of device on which the user interface is displayed, and/or a set of configurations based on capabilities and/or specifications associated with a device on which the user interface is displayed.

Some implementations are described herein in connection with thresholds. As used herein, satisfying a threshold may refer to a value being greater than the threshold, more than the threshold, higher than the threshold, greater than or equal to the threshold, less than the threshold, fewer than the threshold, lower than the threshold, less than or equal to the threshold, equal to the threshold, etc.

No element, act, or instruction used herein should be construed as critical or essential unless explicitly described as such. Also, as used herein, the articles "a" and "an" are intended to include one or more items, and may be used interchangeably with "one or more. Furthermore, as used herein, the term "set" is intended to include one or more items, and may be used interchangeably with "one or more. Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

The presence or absence of a summary, abstract, or claims in this application should in no way be considered as limiting on the scope of any inventions disclosed herein.

What is claimed is:

1. A system comprising
an electrical reference signal generator to provide an electrical reference signal;
at least one optical transmitter to transmit an output optical signal carrying the electrical reference signal; and
at least one optical receiver to receive a reflection of the output optical signal,
the at least one optical receiver including
at least one local oscillator providing local oscillator light at a local oscillator frequency that is not controlled and offset by a frequency difference from the output optical signal,
a combiner for coupling the reflection of the output optical signal with the local oscillator light into a coupled optical signal,
an optical-electrical converter for converting the coupled optical signal into a first electrical signal,
a rectifier to rectify the first electrical signal to provide a first rectified electrical signal, the optical-electrical converter and rectifier having a bandwidth to receive the coupled optical signal and account for variations resulting from at least one frequency chirp of the output optical signal resulting from directly modulating the optical source and the local oscillator light not being controlled;
an electrical combiner to combine the first rectified electrical signal with the electrical reference signal to generate a detection signal based on differences between the first rectified electrical signal and electrical reference signal; and
a signal processor to calculate a distance traveled by the reflection optical signal based on the first rectified electrical signal and the electrical reference signal.

2. The system of claim 1, where
the output optical signal is produced by directly modulating a laser with the reference signal.

3. The system of claim 1, where
the output optical signal is produced by directly modulating a DFB laser with the reference signal.

4. The system of claim 1, where the signal processor includes
an electrical splitter to split the rectified electrical signal into first and second rectified signals,
first and second electrical combiners to combine the first and second rectified signal with the reference signal and provide first and second rectified reference signals; and
a phase detector to detect phase differences between the first and second rectified reference signals.

5. The system of claim 1, where the signal processor includes
an analog to digital converter to convert the rectified reference signal into a digital signal; and
a digital signal processor to process the digital signal.

6. The system of claim 1, where the electrical signal generator is at least one of modulated RF signal from an RF source and a digital signal processor.

7. The system of claim 1, where
the reflection of the optical signal is from an object, and
the calculation includes calculating the distance of the object from the optical system based on the reflection of the output optical signal.

8. A method of measuring comprising:
providing, by an electrical signal generator, an electrical reference signal;
transmitting, by an optical transmitter, an output optical signal carrying the electrical reference signal;

receiving, by an optical receiver, a reflection of the output optical signal as an input optical signal;

providing, by a local oscillator, local oscillator light at a local oscillator frequency, that is not controlled and offset by a frequency difference from the output optical signal, combining, by a combiner, the local oscillator light with the received optical signal to provide a coupled optical signal, converting, by an optical-electrical converter, the coupled optical signal into a first electrical signal, rectifying, by a rectifier, the first electrical signal to provide a first rectified electrical signal, the optical-electrical converter and rectifier having a bandwidth to receive the coupled optical signal and account for variations resulting from at least one of the frequency chirp of the output optical signal resulting from directly modulating the optical source and the local oscillator light not being controlled;

combining, via an electrical combiner, the first rectified electrical signal with the electrical reference signal to generate a detection signal based on differences between the first rectified electrical signal with the electrical reference signal; and processing, by a signal processor, the detection signal to calculate a distance traveled by the reflection of the output optical signal.

9. The method of claim 8, further comprising filtering, by a high pass filter, the first electrical signal.

10. The method of claim 8, where processing includes converting the first rectified electrical signal to a digital signal; and
digitally processing the digital signal.

11. The method of claim 8, further comprising amplifying, by a linear amplifier, the first electrical signal.

12. The method of claim 8, where the reflection of the optical signal is from an object, and
the calculation is at least one of distance and velocity of the object based on the reflection of the output optical signal.

13. The method of claim 8, where
the electrical reference signal generator is one of an RF source and a digital signal processor.

14. The method of claim 8, where
the electrical reference signal generator includes a time-stamp.

15. The method of claim 12, where
the velocity is calculated based on successive distance calculations.

16. The system of claim 1, where
the optical-electrical converter has a bandwidth of at least 40 GHz.

17. The method of claim 12, where
the optical-electrical converter has a bandwidth of at least 40 GHz.

18. The system of claim 1, where
the optical source is directly modulated with a modulation index of less than 1.

19. The system of claim 1, where
the electrical reference signal generator is an electrically generated frequency-modulated continuous wave (EFMCW) generator.

20. The system of claim 1, where
the optical source includes a bias current controlled to produce an optical frequency-modulated continuous wave (OFMCW) output optical signal.

* * * * *